United States Patent [19]

Kobayashi et al.

[11] Patent Number: 4,958,722
[45] Date of Patent: Sep. 25, 1990

[54] TRANSFER APPARATUS FOR LEAD FRAME

[75] Inventors: Hiroaki Kobayashi, Yokohama; Kenji Hashimoto, Kawasaki, both of Japan

[73] Assignee: Kabushiki Kaisha Toshiba, Kawasaki, Japan

[21] Appl. No.: 398,505

[22] Filed: Aug. 25, 1989

[30] Foreign Application Priority Data

Aug. 25, 1988 [JP] Japan .................. 63-211422

[51] Int. Cl.⁵ .............................................. B65G 19/28
[52] U.S. Cl. .................. 198/735.3; 198/740; 29/741
[58] Field of Search ............ 198/341, 345, 735, 860.3, 198/861.1, 836, 803.01, 803.2, 465.1, 465.2, 465.3, 692, 740; 29/33 P, 759, 741

[56] References Cited

U.S. PATENT DOCUMENTS

| | | | |
|---|---|---|---|
| 2,851,145 | 9/1958 | Gagnon | 198/345 |
| 2,857,035 | 10/1958 | Gagnon | 198/692 X |
| 4,202,092 | 5/1980 | Shibasaki et al. | 29/741 |
| 4,449,986 | 5/1984 | Held | 198/341 X |
| 4,516,318 | 5/1985 | Kirschenman | 198/345 X |
| 4,516,673 | 5/1985 | Kashihara et al. | 198/345 X |
| 4,624,358 | 11/1986 | Satou | 198/345 |
| 4,660,280 | 4/1987 | Asai et al. | 198/345 X |
| 4,674,238 | 6/1987 | Suzuki et al. | 198/735 X |
| 4,754,867 | 7/1988 | DeAnda | 198/836 X |
| 4,819,326 | 4/1989 | Stannek | 29/741 X |

FOREIGN PATENT DOCUMENTS 51-44064 11/1976 Japan .
58-157620 9/1983 Japan .
59-172731 9/1984 Japan .

Primary Examiner—Joseph E. Valenza
Assistant Examiner—Darrell G. Dayoan
Attorney, Agent, or Firm—Foley & Lardner, Schwartz, Jeffery, Schwaab, Mack, Blumenthal & Evans

[57] ABSTRACT

A lead frame transfer device has a pair of guides and a transfer mechanism. At least one of the guides has a first guide rail adapted for moving in the widthwise direction of a lead frame, a second guide rail which is biased by a biasing mechanism to cause the second guide rail move toward the first guide rail in the widthwise direction of the lead frame so that the position of the second guide rail with respect to the first guide rail can be varied. Depending upon the widthwise size of a lead frame, the first guide rail of the guide is moved in the widthwise direction of the lead frame by a driving unit. In response to the movement of the first guide rail, the second guide rail is moved concurrently under by the force of a biasing mechanism and the lead frame can be held at a predetermined position under the pressure of the biasing mechanism.

6 Claims, 5 Drawing Sheets

TRANSFER APPARATUS FOR LEAD FRAME

BACKGROUND OF THE INVENTION

The present invention relates to a lead frame transfer apparatus used in a semiconductor production line.

In the case of the production of the semiconductor devices, after the completion of the wafer process, in order to draw electrodes on a semiconductor chip and connect them to leads of a package, a die bonding process for bonding a semiconductor chip to a lead frame, a wire bonding process for connecting and the electrodes on the semiconductor chip to the leads of a lead frame and a resin molding process for sealing the semiconductor chip with a resin to form a package are carried out. In each process and between processes, a lead frame is handled as a unit part so that transfer thereof is one of the very important matters in the production of semiconductor devices.

Depending upon the shapes, the number of pins and other factors of semiconductor devices, various types of lead frames exist. Since a plurality of semiconductor chips are mounted on each lead frame, the widths of the lead frames are standardized in order that the storage and transfer of the lead frames may be facilitated. But some of the lead frames have different widths, respectively. Therefore lead frame transfer apparatuses can preferably vary their width as needs demand.

FIG. 1 is a perspective view of a conventional frame transfer apparatus which is used, for instance, in the wire bonding stage. Lead frames 1, upon each of which a plurality of semiconductor chips 2 are mounted, are stored in a lead frame magazine 32. The lead frames 2 are pulled out of the lead frame magazine 32 by a feed pawl 42 one at a time and are placed between guide rails 4 and 5 and then transferred by another feel pawl 43 so as to be stored into an empty frame magazine 33 disposed at the other ends of the guide rails 4 and 5 remote from the storage magazine 32 after completion of wire bonding. The frame magazines 32 and 33 are equipped with magazine elevators 34 and 35, respectively, which in turn are engaged with lead screws 38 and 39 rotated by motors 30 and 31 so that the elevators 34 and 35 are vertically displaced along sliding shafts 36 and 40 and the sliding shafts 37 and 41, respectively.

In the vicinity of the mid-point of the guide rail pair 4 and 5 between the lengthwise ends, a wire bonder 45 is disposed. Its arm 45b is operated so that a wire 45a is fed so as to electrically interconnect each electrode on the semiconductor chip 2 and a corresponding lead on the lead frame 1.

FIG. 2 is a sectional view taken along the line A—A of FIG. 1. The guide rails 4 and 5 are provided on the upper surface of a base 21 with bolts 22 and nuts 23 in such a way that the guide rails 4 and 5 are slidable in the widthwise direction of the lead frame 1 if the bolts are loosened. Side edges of the lead frame 1 upon which the semiconductor chips 2 are mounted are inserted into and supported by grooves 4b and 5b which are formed by a cut-out portion 4a (5a) cut out on the inner side of the top surface of the guide rail 4 (5) and a cover plate 4c (5c). A heater block 3 for heating the lead frame 1 during the wire bonding operation is disposed substantially at the mid-point between the guide rails 4 and 5.

In the case of the lead frame transfer apparatus of the type described above, the width L between the guide rails 4 and 5 must be so adjusted that the width between the grooves 4b and 5b becomes slightly wider than the width of the lead frame 1. Thus in the case of the adjustment of the width L, a troublesome and time-consuming manual operation of loosening the bolts 22 and nuts 23 is required in order to place the guide rail 4 and 5 at their predetermined position. Moreover, as a result, during the widthwise adjustment, the production line is stopped. Generally speaking, the shorter the adjustment time interval, the higher the operational efficiency of the production line becomes. From this point of view, the shut-down time interval of the production line due to the adjustment of the width L between the guide rails 4 and 5 cannot be neglected, because as described above, the widths of the lead frames 1 vary over a wide range. One of the measures for shortening the width adjustment time interval is to place a rail width gauge 24 between the guide rails as shown in FIG. 2. However, when such a gauge 24 is used, the production line is shut down for tens of minutes for each width adjustment operation. Especially, since there is a current trend in which many types of semiconductor devices are respectively produced with a small quantity, there arises a problem that the number of width adjustment operations is increased.

In view of the above, the same inventor proposed a lead frame transfer apparatus which is disclosed in detail in Japanese Laid-Open Patent Application No. 59-172631, so that the width between the guide rails can be automatically varied in response to types of lead frames.

However, even with such automatic width adjustment apparatus, there often arises a problem in which the transfer of the lead frame 1 becomes impossible because of the thermal expansion of the lead frame heated by the heater block 3 so that its side edges are brought into contact with the bottoms of the grooves 4b and 5b of the guide rails 4 and 5. A further problem is such that during attaching the lead frame 1 to guide rails, deformation or bending of the lead frame occurs, resulting in the break of a wire connection. A yet further problem is such that because of the tolerances in the width of the lead frames 1 defined by the same standard, if the guide rail width L is adjusted for the width of a certain lead frame 1, some other lead frames may be deformed.

As described above, the conventional lead frame transfer apparatuses have the problems that a long time interval is required for the adjustment of the width between the guide rails and that deformations of the lead frames and wire breaks occur due to the thermal expansion of the lead frame and tolerances in size after the guide rail width adjustment.

SUMMARY OF THE INVENTION

In view of the above, the primary object of the present invention is to provide a lead frame transfer apparatus which can change the width of the guide rails on the basis of a width of a lead frame, transfer the lead frame, and locate it at a right position of the wire bonding stage, etc., without causing the deformations of the lead frame and the breakage of wires.

According to the present invention, there is provided a lead frame transfer apparatus comprising a pair of parallel guide means for engagement with and support of a lead frame; and driving means for moving at least one of said guide means toward and away from the other guide means in the widthwise direction of the lead frame;

at least one of said guide means having a first guide rail which is driven by said driving means in the widthwise direction of said lead frame and a second guide rail adapted to be moved in the widthwise direction of said lead frame so as to change the position of said second guide rail with respect to said first guide rail and biasing means for biasing the second guide rail towards the first guide rail;

said driving means comprising a driving unit for driving said first guide rail, memory means for previously storing therein the data regarding to the width of said lead frame, and a control unit for controlling said driving unit in response to said data, whereby said lead frame is transferred in the longitudinal direction while maintaining a predetermined gap between each of said side edges of said lead frame and each of said two guide means. Furthermore one of said first and second guide rails is driven by said driving means to move toward or away from the other guide means so that a plurality of types of lead frames having different widths can be transferred.

In the lead frame transfer apparatus in accordance with the present invention, depending upon the width of a lead frame, the first guide rail of the guide means is caused to move in the widthwise direction of the lead frame by the driving device. In response to the movement of the first guide rail, the second guide rail is caused to move concurrently under the force of the biasing means and the lead frame is held at a proper condition under the pressure of the biasing means.

Since the lead frame transfer device according to the present invention has the biasing means which presses the second guide rail to the first guide rail, the lead frame is maintained in the stationary state under the pressure from the biasing means. Therefore, the thermal expansion and error in size can be eliminated so that the transfer of the lead frame and the positioning at bonding stage can be accomplished within a short time interval without causing deformations of the lead frames and breakages of wires.

DETAILED DESCRIPTION OF THE PREFERRED EMBODIMENTS

Figure 1:
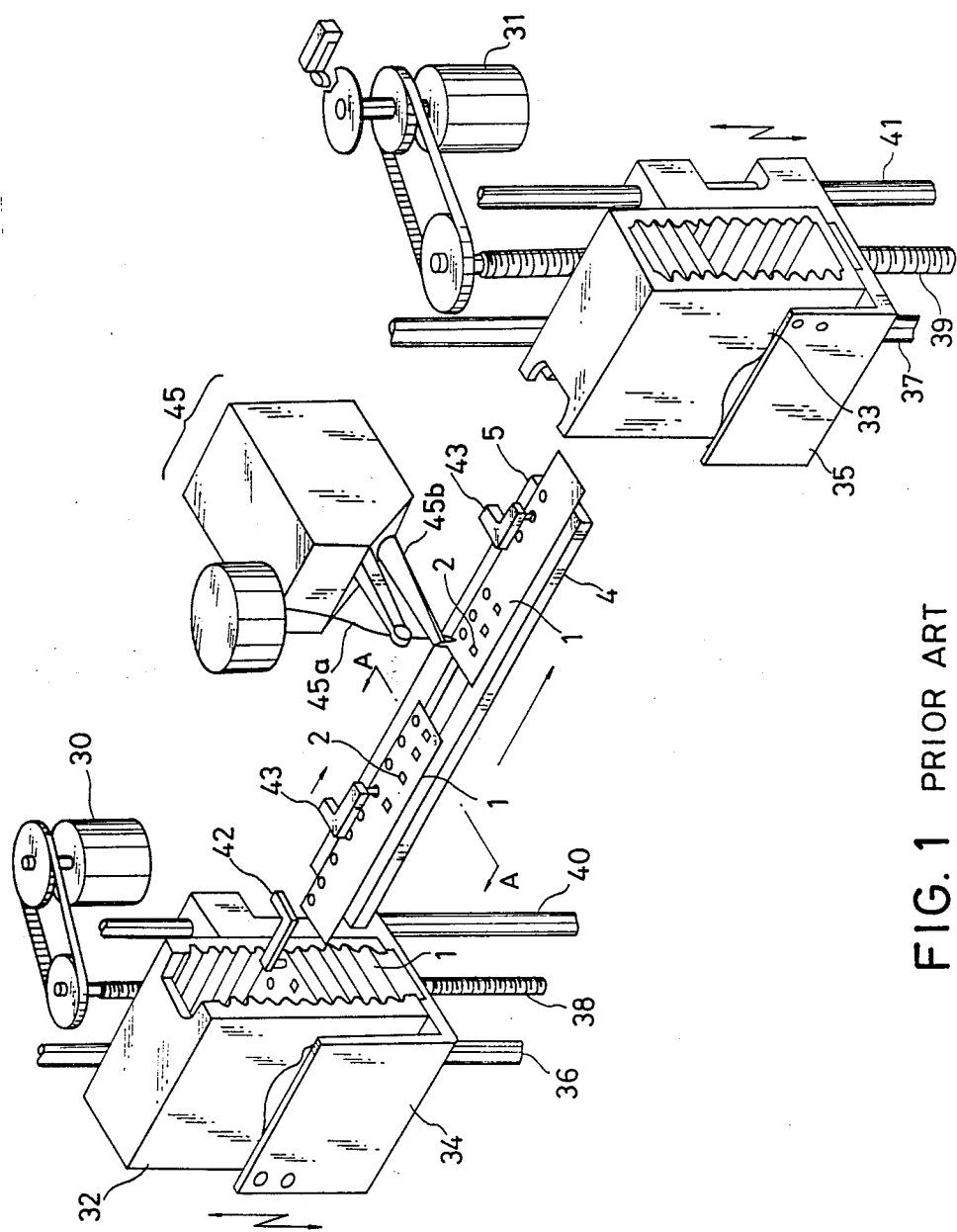
FIG. 1 is a perspective view illustrating a conventional lead frame transfer apparatus used for the bonding station.
Figure 2:
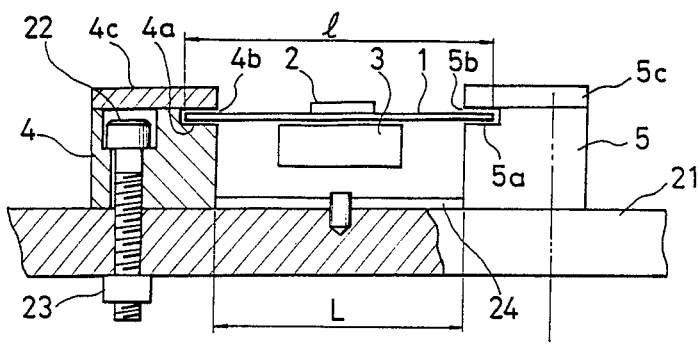
FIG. 2 is a sectional view taken along the line A—A of FIG. 1.

The preferred embodiments are now described below. In every embodiment the same reference numerals are used to designate similar parts throughout the figures.

Figure 3:
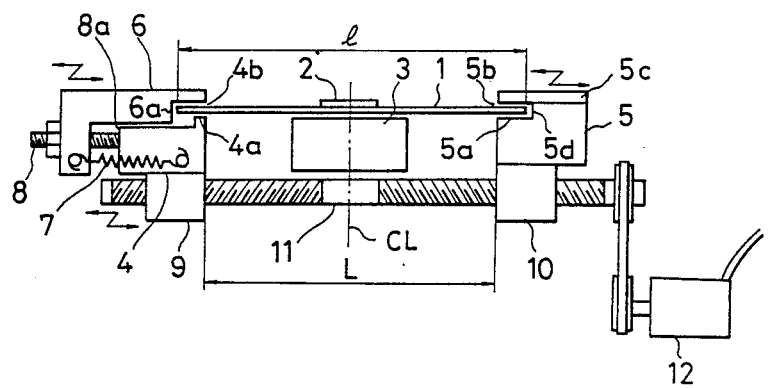
FIG. 3 is a view of a first preferred embodiment of a lead frame transfer apparatus in accordance with the present invention illustrating the schematic construction thereof.

Referring first to FIG. 3, illustrating a first embodiment according to the present invention, a pulse motor 12 drives lead screw 11 so that nuts 9 and 10 engaged with the lead screw 11 are displaced in the widthwise direction of a lead frame. As a result, guide rails 4 and 5 mounted on the nuts 9 and 10, respectively, are transversely displaced so that the width therebetween increases or decreases.

As best shown in FIG. 3, one of the guide rail subassemblies comprises a first guide rail 4 and a second guide rail 6. The second guide rail has an L-shape in cross section and is movable in the widthwise direction of the lead frame and is normally biased inwardly under the force of a tension spring 7 loaded between the guide rail 4 and the guide rail 6. The guide rail 6 slides on a slide guide (not shown). A stopper 8 is provided to the vertical wall of the guide rail 6, and the inner end 8a of the stopper 8 is made into contact with the outer surface of the guide rail 4 so that the inner limit of the displacement of the guide rail 6 is defined. The stopper 8 is in the form of an externally threaded screw, and upon rotation of the stopper 8, the limit width between the guide rails 5 and 6 can be adjusted.

The lead frame 1 is transferred, after the distance between the guide rails 4 and 5 is expanded in such a way that the side edges of the lead frame 1 are spaced apart from the bottoms 6a and 5d of the grooves 4b and 5b, respectively, as shown in FIG. 1. When the wire bonding operation is carried out, the guide rails 4 and 5 are moved toward each other so as to securely hold the lead frame 1 in the stationary state. In response to the movement of the guide rail 4, the guide rail 6 biased inwardly under the force of the tension spring 7 is caused to move inwardly so that the lead frame 1 is forced to be held under the pressure of the tension spring. It is preferable that the spring constant of the tension spring is selected to be low so as to avoid the deformation of the lead frame 4.

Figure 4:
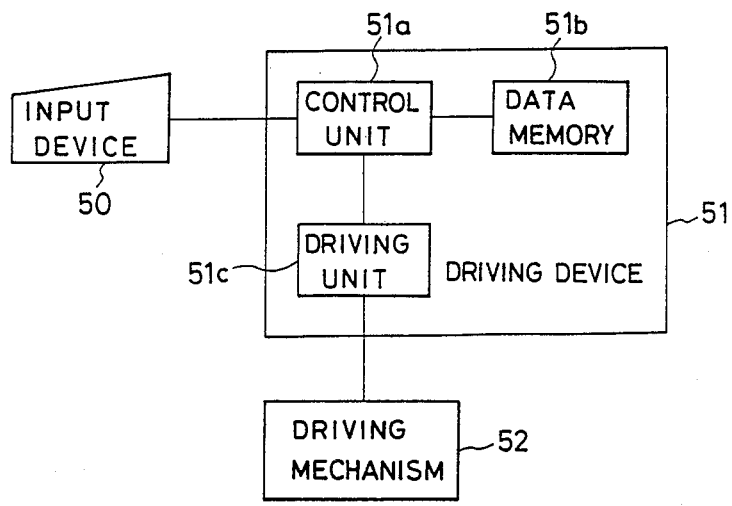
FIG. 4 is a block diagram illustrating a driving device used in the lead frame transfer apparatuses apparatus in accordance with the present invention.

Referring next to FIG. 4, the driving device 51 for driving the guide rails 4 and 5 will be described in detail.

The driving device 51 comprises a control unit 51a, a data memory 51b, and a driving unit 51c which is, for instance, a stepper motor. An input device 50 such as a keyboard is connected to the control unit 51a. A driving mechanism 52 comprising the lead screw 11 and the like is connected to the driving unit 51c.

Figure 5:
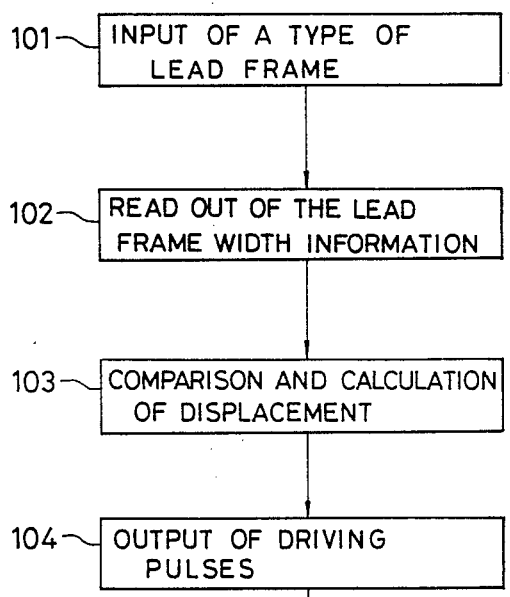
FIG. 5 is a flowchart illustrating the mode of operation of the driving device shown in FIG. 4.

FIG. 5 shows a flowchart illustrating the mode of operation of the driving device 51.

First, the data representative of a type of lead frames to be transferred is input to the control unit 51c of the driving device 51 (Step 101). In response to the data thus transferred, an address of the data memory 51b is designated so that the data concerning the width of the lead frames (to be referred to as "the lead-frame width data" hereinafter in this specification) is read out (Step 102). Next the control unit 51a compares the width between the guide rails 4 and 5 with the read out data (step 103) prior to the displacement, then computes the displacent value (Step 103). In response to the displacement value thus detected, the driving pulses are generated from the control unit 15a and are applied to the driving unit 51c, i.e. the stepper motor 12 (Step 104). In response to the driving pulses thus received by the driving unit 51c, the lead screw 11 in the driving mechanism 52 is rotated by the stepper motor 12.

By the rotation of the lead screw, nuts 9 and 10 and the guide rails 4 and 5 provided thereon are moved toward each other or away from each other. The lead screw 11 has a right-handed screw part and a left-handed screw part so that in response to the direction of rotation of the lead screw, the nuts 9 and 10 are caused to move toward or away from other whereby the distance between the nuts 9 and 10 can be increased or decreased. In this case, the nuts 9 and 10 are moved toward or away from each other in such a way that they are in symmetrical positions about the center line CL all the time.

As described above, according to the preferred embodiment, the adjustment between the guides and lead frames can be automatically accomplished within a short time interval with a high degree of accuracy without manual operation. As a result, the shut-off time interval of a production line can be reduced to the minimum. Furthermore, when the lead frame 1 must be maintained in the stationary state, e.g. during the wire bonding process, under the force of the tension spring 7 which is an elastic body, the guide rails 4 and 5 are elastically pressed against the lead frame 1 so that the thermal expansion and the tolerance of the lead frame can be absorbed. Accordingly, the deformation of the lead frame and the breakage of wire can be prevented. Moreover, because the guide rails 4 and 5 are always maintained symmetrical with respect the center line CL, the center position of the lead frame is always maintained at a predetermined point so that the operation for adjusting the the manual adjustment can be eliminated.

Figure 6:
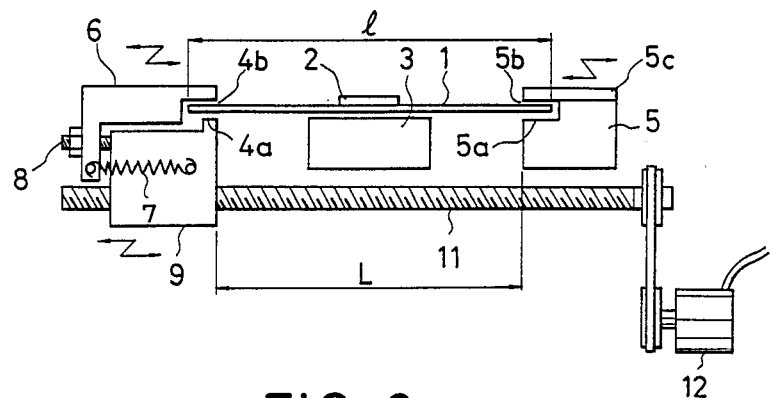
FIG. 6 is a schematic view illustrating a second preferred embodiment of the present invention.

FIG. 6 illustrates a second preferred embodiment of the present invention which is substantially similar in construction to the first preferred embodiment described above, except that only one guide rail subassembly 6.9 is movable. When the driving device 51 drives the nut 9, the guide rail 6, which is connected through the tension spring 7, is forced to move toward the guide rail 5 so that the force of the tension spring 7 holds the lead frame and maintains it in the stationary state as described above in the first preferred embodiment. In the second embodiment, the position of the center line of the lead frame 1 is displaced depending upon the width of the lead frame 1. As a result, it is necessary to adjust the relative position of the lead frame 1 with respect to the wire bonder 45, but the mechanism of this type is simple in construction and inexpensive to fabricate.

Figure 7:
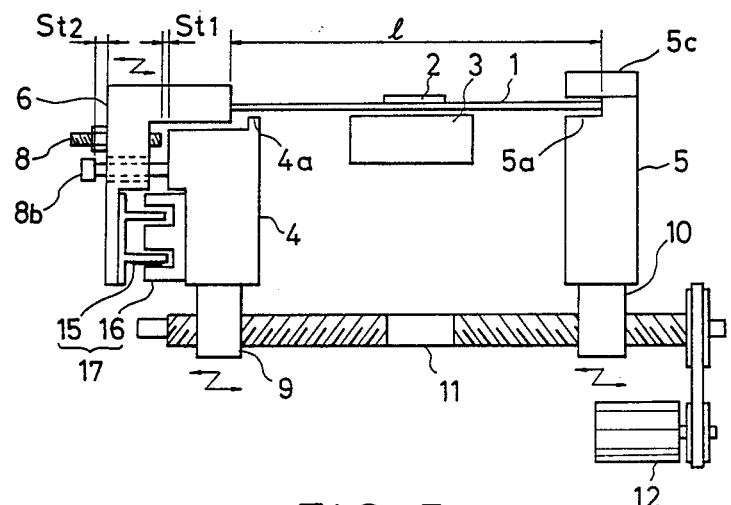
FIG. 7 is a schematic view illustrating a third preferred embodiment of the present invention.

FIG. 7 illustrates a third preferred embodiment of the present invention which is substantially similar in construction to the first or second embodiments described above, expect that in order to accomplish the same action as the tension spring 7, a voice coil motor 17, consisting of a voice coil 15 and a magnet 16, is used instead of the tension spring 7. By varying the direction and the electric current value flowing through the voice coil 15, the electromagnetic force is varied and, consequently, the force acting from the guide rail 6 on the guide rail 4 can be controlled.

Under the electromagnetic force described above, the guide rails 6 and 5 can elastically press the lead frame 1 so as to maintain it in the stationary position. The pressure imparted to the lead frame 1 can be freely varied depending upon the thickness, width and so on of the guide frame 1 to be transferred. According to the third embodiment, by decreasing the mass of the guide rail 6 which is movable in the traverse direction, the width l can be varied at a high speed and at any arbitrary timing so that the lead frames 1 can be transferred at a high velocity.

In the third embodiment, in order to avoid that the guide rail 6 is endlessly moved away from the guide rail 4 because of the repelling force interacting between the voice coil 15 and the magnet 16, there is provided in addition to a stopper 8 for preventing the excess inward movement of the the guide rail 6, a stopper 8b having an enlarged-diameter end attached to the guide rail 4 and extended through a through hole defined in the guide rail 6.

Alternatively, the tension spring as described in the first and second embodiments can be provided between the first guide rail 4 and the second guide rail 6. According to this embodiment, the voice coil motor 17 moves the second guide rail 6 outwardly against the force of the tension spring.

Figure 8:
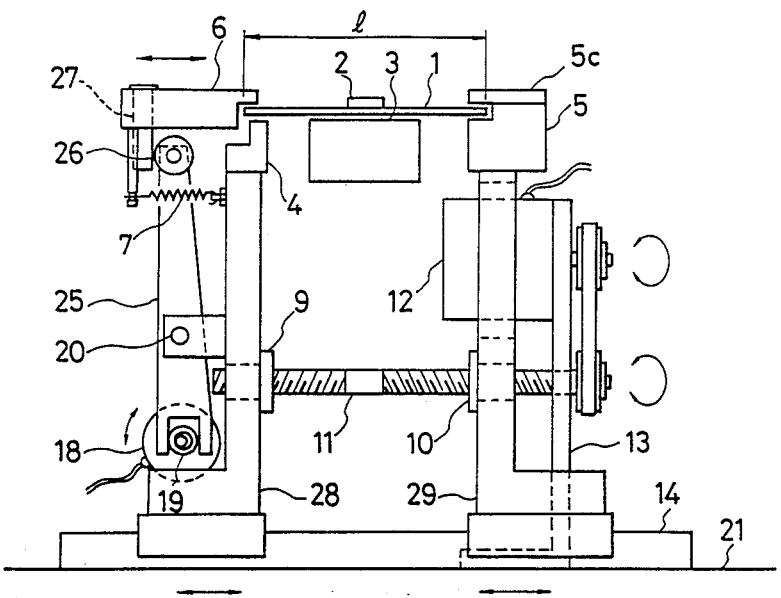
FIG. 8 is a schematic front view illustrating a fourth preferred embodiment of the present invention.
Figure 9:
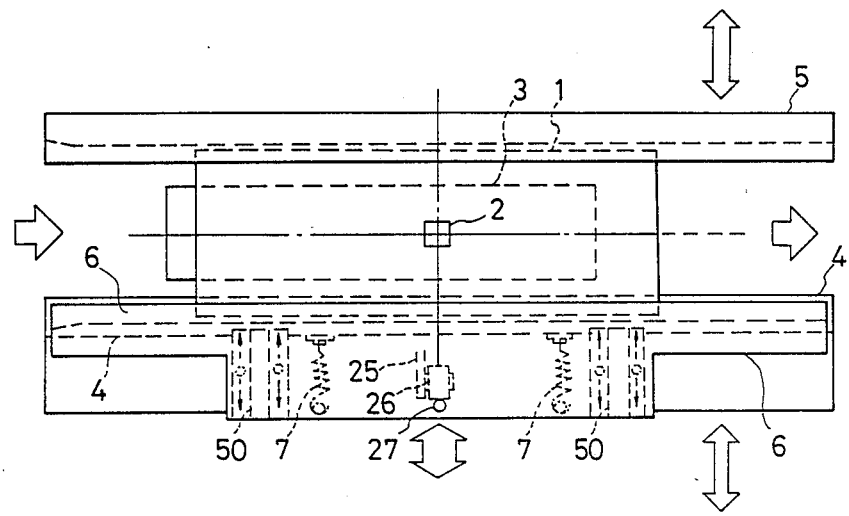
FIG. 9 is a top view used to explain the mode of operation of the fourth embodiment shown in FIG. 8.

FIG. 8 is a front view of the fourth embodiment of the present invention, and FIG. 9 shows its top view. On the base 21, linear guides 14 are secured. Sliders 28 and 29 having substantially L shape slide on the linear guides. Nuts 9 and 10, which engage with the lead screw 11, are inserted in the vertical walls of the sliders 28 and 29, respectively. On the top end of the sliders 28 and 29, guide rails 4 and 5 are secured, respectively. A motor 12 is secured to the base 21 using a motor bracket 13. As described for the above-mentioned embodiments, the distance between two guide rails 4 and 5 can be varied by rotating the lead screw 11 driven by the motor 12.

In one guide rail subassembly, the second guide rail 6 is slidable on the slide rails 50 in the widthwise direction of the lead frame and is normally biased inwardly under the force of a tension spring 7 loaded between the guide rail 4 and the guide rail 6. A follow pin 27 is protrudingly provided at the bottom surface of the guide rail 6. On the lower base part of the slider 28, a motor 18 for driving the second rail 6 is provided. The motor 18 has an eccentric shaft and an end of a lever 25 is engaged with the eccentric shaft. This lever 25 is supported at a fulcrum 20 and is rotatable on the falculm 20. At the other end of the lever 25, a bearing 26 is provided rotatably.

Since the guide rail 6 is pulled inwardly by the tension of spring 7, the follow pin 27 always touches and presses the bearing 26 toward the guide rail 4. Accordingly, by rotating the motor 18, the guide rail 6 can be moved independently of the first guide rail 4 and the distance between them can be arbitrarily changed. Such a mechanism facilitates the adjustment of pressure to hold the lead frame.

It is to be understood that the present invention is not limited to the above described embodiments and that various modifications can be effected without departing from the spirit of the present invention. For instance, in the first and second embodiments, the tension spring is used, but any other suitable elastic materials such as rubber may be also equally used. Furthermore it has been described that the feed pawl is used in the lead frame transfer mechanism, but any other suitable means such as rollers may be used. In addition, it has been described that the stepper motor and the lead screw are used to drive the guide rails, but any other suitable means such as a linear stepper motor, a linkage, or the like may be used.

What is claimed is:

1. A transfer apparatus for a lead frame, the lead frame having side edges, the transfer apparatus comprising:
   a pair of parallel guide means for engaging with a lead frame and for supporting it;
   driving means for moving at least one of said guide means toward and away from the other guide means in the widthwise direction of the lead frame; and
   transfer means for transferring said lead frame to a longitudinal direction thereof;
   at least one of said guide means having a first guide rail which is driven by said driving means in the widthwise direction of said lead frame and a second guide rail which is movable in the widthwise direction of said lead frame so as to change the position to said second guide rail with respect to said first guide rail, and having biasing means for biasing said second guide rail toward said first guide rail;
   said driving means comprising a driving unit for driving said first guide rail, memory means for previously storing therein the data regarding the width of said lead frame, and a control unit for controlling said driving unit in response to said data, whereby said lead frame is transferred in the longitudinal direction while maintaining a predetermined gap between each of the side edges of said lead frame and each of said guide means and, furthermore, one of said guide means is driven by said driving means to move toward or away from the other guide means so that a plurality of types of lead frames having different widths can be transferred.

2. The lead frame transfer apparatus as set forth in claim 1, wherein said biasing means is an elastic means for pulling said second guide rail toward said first guide rail.

3. The lead frame transfer apparatus as set forth in claim 1, wherein said biasing means comprises a coil and a magnet.

4. The lead frame transfer apparatus as set forth in claim 2, wherein said guide rails are spaced apart from each other, said apparatus further comprising stopper means for limiting the movement of said second guide rail towards said first guide rail to provide a predetermined minimum spacing between said first and second guide rails.

5. The lead frame transfer apparatus as set forth in claim 3, wherein said guide rails are spaced apart from each other, said apparatus further comprising a first stopper means for limiting movement of said second guide rail towards said first guide rail to provide a predetermined minimum spacing between said first and second guide rails; and
   a second stopper means for preventing said second rail from moving away from said first guide rail in excess of a predetermined amount to provide a maximum predetermined spacing between said first and second guide rails.

6. The lead frame transfer device as set forth in claim 1, further comprising a displacement mechanism for permitting said second guide rail to move independently of said first guide rail against the force generated by said biasing means.

* * * * *